Figure 1:
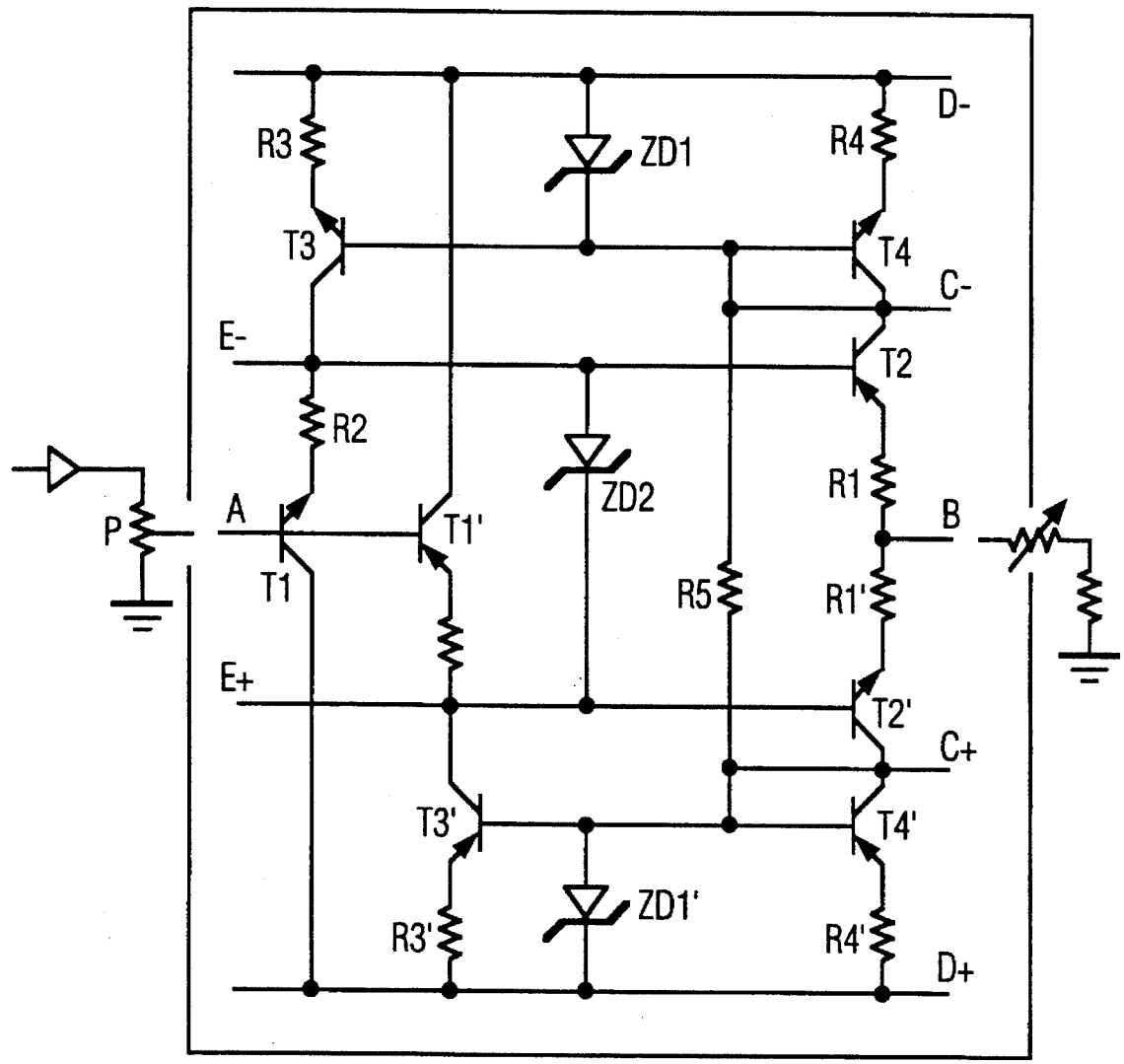

United States Patent [19]

Köllner

[11] Patent Number: 5,455,533
[45] Date of Patent: Oct. 3, 1995

[54] TRANSDUCER CIRCUIT WITH ADJUSTABLE OUTPUT IMPEDANCE

[75] Inventor: Hartmut Köllner, Hanover, Germany

[73] Assignee: Telefunken Fernseh und Rundfunk GmbH, Hanover, Germany

[21] Appl. No.: 133,234

[22] Filed: Oct. 7, 1993

[30] Foreign Application Priority Data

Apr. 12, 1991 [DE] Germany ............... 41 11 999.1

[51] Int. Cl.$^6$ ............................................. H03K 17/60
[52] U.S. Cl. ................................... 327/484; 327/576
[58] Field of Search ...................... 307/315, 558, 307/255, 313; 327/108, 319, 484, 575, 576, 490, 491, 509

[56] References Cited

U.S. PATENT DOCUMENTS

| | | | |
|---|---|---|---|
| 3,336,511 | 8/1967 | Wajs | 307/255 |
| 4,123,723 | 10/1978 | Sugawara | 307/313 |
| 4,371,792 | 2/1983 | Dobkin | 307/315 |
| 4,633,100 | 12/1986 | van Tuijl | 307/315 |
| 4,771,227 | 9/1988 | Nelson | 323/315 |

FOREIGN PATENT DOCUMENTS

| | | | |
|---|---|---|---|
| 0209987 | 1/1987 | European Pat. Off. | H03F 3/30 |
| 0394807 | 10/1990 | European Pat. Off. | H03F 1/30 |
| 3035471 | 9/1980 | Germany | H03F 1/32 |
| L059112 | 2/1967 | United Kingdom | H03F 3/04 |

OTHER PUBLICATIONS

8181 New Electronics 19(1986) Nov., No. 22, London, Great Britain p. 12.

Primary Examiner—Timothy P. Callahan
Assistant Examiner—Terry L. Englund
Attorney, Agent, or Firm—Joseph S. Tripoli; Eric P. Herrmann

[57] ABSTRACT

An impedance converter includes an emitter follower constructed of a first transistor with a first resistor connected between an emitter electrode of the first transistor and an output terminal. Input to the emitter follower is provided by a second transistor of complementary type, with input signal applied to the base of the second transistor and the emitter electrode of the second transistor coupled to the base of the first transistor with a second resistor. Bias current in the second transistor and second resistor is in constant proportion to bias current in the first transistor and first resistor. Output impedance can be made positive, negative or zero by appropriate proportioning of the first and second resistors.

14 Claims, 14 Drawing Sheets

TRANSDUCER CIRCUIT WITH ADJUSTABLE OUTPUT IMPEDANCE

This is a continuation of PCT application PCT/EP92/00824 filed Apr. 11, 1992 by Hartmut Kollner and titled "Transducer Circuit."

The invention relates to a converter circuit consisting of a first transistor to whose base an input signal can be supplied, a second transistor which is complementary to the first transistor and whose base is connected to the emitter of the first transistor and whose emitter is connected via a first resistor to an output terminal and including a current supply circuit which ensures that there is a substantially equal flow of current through the emitter collector paths.

A converter circuit of this type is known from DE 30 35 471 A1. The circuit illustrated there in FIG. 3 thus consists of two emitter followers connected in cascade like manner. Due to the positive temperature co-efficients of the bipolar transistors used, the quiescent current in the complementary stages has to be stabilized by the first resistor forming a current feedback coupling. Hereby, there arises an output current dependent voltage drop on the feedback resistor which leads to a reduced voltage drive, since the sweep width of the control voltage is greater than the sweep width of the output voltage. Consequently, the emitter follower of this configuration does not have the required properties of an ideal impedance converter, namely, a very low output resistance which is about zero. In a known circuit arrangement, the disadvantage of the limited low output resistance is frequently compensated by heavy feedback over all of the stages (voltage and current amplifier stages) of the converter.

Furthermore, it has been attempted to reduce the negative effect of the current feedback resistor at the latter itself, for example, by bridging this resistor with diodes, by means of current balancing circuits or quad bridge circuits. However, all these circuits always require extensive quiescent current stabilization, selected transistors and (for the quad circuit) a circuit concept that involves great difficulties as regards its dimensioning. The diode transfer is only effective from a voltage of 0.6 V, the quiescent current must lie below 0.6 V so that the setting of the quiescent current is not freely selectable. For complementary amplifiers operating in Class A or Class AB, transfer distortions then arise. The current balancing circuits only permit of an approximation to the output resistance of zero at relatively great expense.

The circuit concept mentioned hereinabove has the advantage that the emitter followers, which are the inverse of one another and through which substantially equal currents flow, result in a compensation of the non-linear characteristic curves of the transistors. The known circuit concept is frequently used for distortionless amplifiers but does not allow of a construction as an impedance converter that verges on the ideal.

The object of the invention is to construct a converter circuit of the type mentioned hereinabove such that an output resistance of virtually zero is achievable and the control characteristic curve distortions are completely compensated.

In accordance with the invention this object is achieved in a converter circuit of the type mentioned hereinabove by a second resistor which is connected to the emitter of the first transistor and which is traversed by the collector emitter current of the first transistor and via which the emitter of the first transistor is connected to the base of the second transistor.

Due to the insertion of the resistor in accordance with the invention in the connection between the emitter of the first transistor and the base of the second transistor so that the emitter collector current of the first transistor flows through the second resistor, there is an automatic compensation of the voltage drop across the first resistor which is acting as a current feedback resistor, in that the voltage at the base of the second transistor is exactly compensated by the voltage drop across the first resistor when the two resistors are equally large. Moreover, by an appropriate dimensioning of the second resistor relative to the first resistor, arbitrary positive or negative output resistances of the converter can be set-up. Self evidently, precautionary measures must be taken in the case of a negative output resistance. For equal currents, the compensation is limited by the different polarities of the input and output transistors and the different working points associated therewith. In order to obtain a complete symmetry of the characteristic curves between the input and output transistors for equal currents, a respective complementary transistor connected as a diode is inserted in series with each of them as a compensating resistance. Both characteristic curves (transistor and diode), when combined together, produce a new characteristic control curve which is fully compensatable and is the same for both sides.

Preferably, the current supply circuit contains a known current mirror including two transistors having their bases connected together.

A particularly advantageous embodiment of the circuit in accordance with the invention can be realised when the two transistors of the current mirror exhibit a different polarity so that they have the same polarity as the first or second transistor respectively assigned to them and traversed by the same current. In this case, it is then possible to construct the two transistors traversed by the same current as identical double transistors over a common substrate whereby similar properties and similar characteristic curves of the two transistors are ensured.

Thereby, it may be expedient if the first transistor together with the second resistor and the appertaining transistor of the current mirror form a configuration having two like poled transistors and an intermediately connected resistor which is realised inversely at the second transistor together with an intermediately connected resistor and the appertaining transistor of the current mirror. In this way, the circuit concept in accordance with the invention can be constructed from two double transistors.

The converter circuit in accordance with the invention may be constructed as a complementary converter circuit whereby the components are doubled as an inverse mirror image. In this embodiment, four similar configurations form successively connected arms of a bridge. A fully symmetrical and completely equivalent construction in each arm of the bridge can be achieved in that a respective resistor, whose value corresponds to the first resistor, is additionally connected in each arm of the bridge. The first resistor, acting as a feedback resistor, is also then integrated into the bridge circuit.

The position of the working point of the converter is selectable by a bias voltage source which is connected to the base of the second transistor. In the complementary construction of the converter circuit, the bias voltage is arranged between the bases of the second transistors that are the inverse of one another.

Alternatively however, the bias voltage source may be connected in the form of a linear resistor or a voltage dependent resistor in a quiescent current limiting auxiliary path of the circuit. In this case, the quiescent current can be set by means of the current sources present in a further auxiliary path of the circuit.

The circuit in accordance with the invention permits a quiescent current to be freely selected and set internally without disturbing the symmetry of the circuit.

The circuit arrangement in accordance with the invention permits the realisation of universal modules having ideal properties. In particular, the realisation of ideal transistor structures is possible whereby the vertical symmetry in the current branches formed by the first and the second transistor is of decisive significance.

The invention is to be explained more fully hereinafter with the help of embodiments illustrated in the drawing. Therein FIG. 1 shows a complementary impedance converter circuit.

Figure 2A:
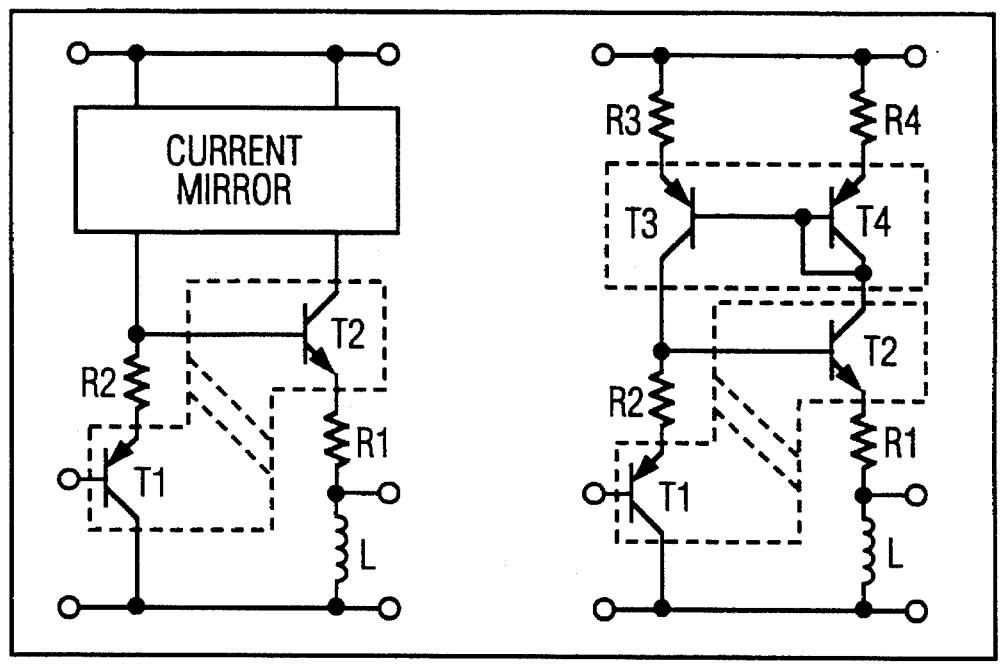

FIG. 2A: a schematic diagram of the basic construction of an impedance converter circuit having a current mirror consisting of two similar transistors (horizontal symmetry).

Figure 2B:
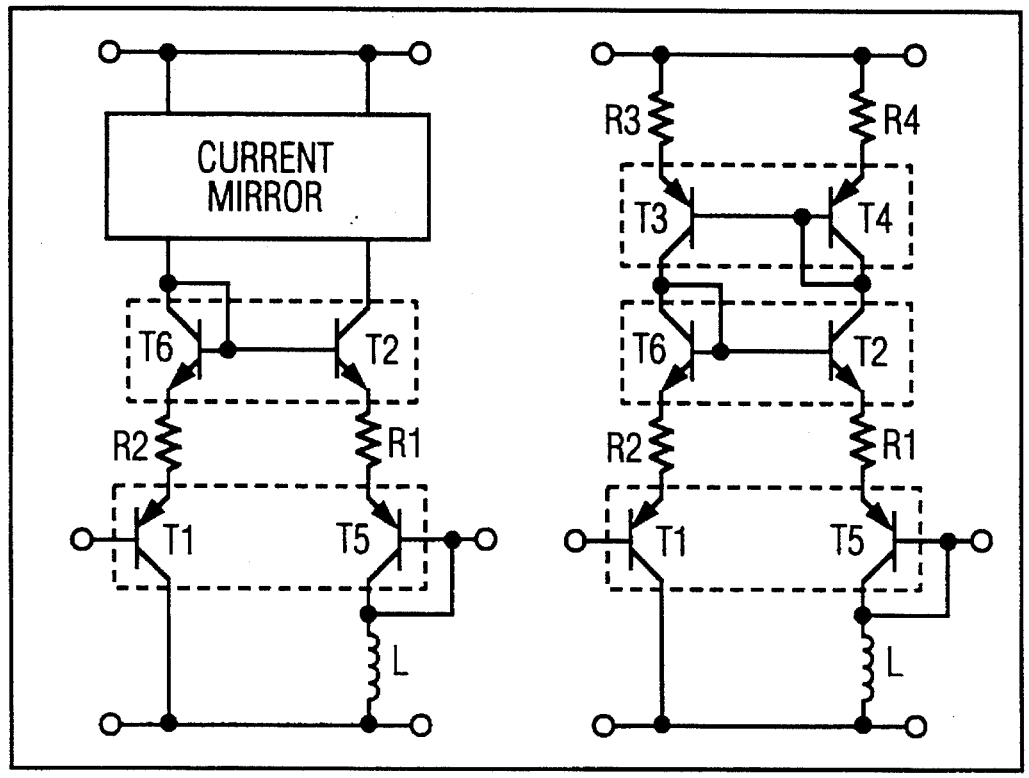

FIG. 2B: a variant having additional complementary transistor diodes for the formation of a horizontal symmetry.

Figure 3:
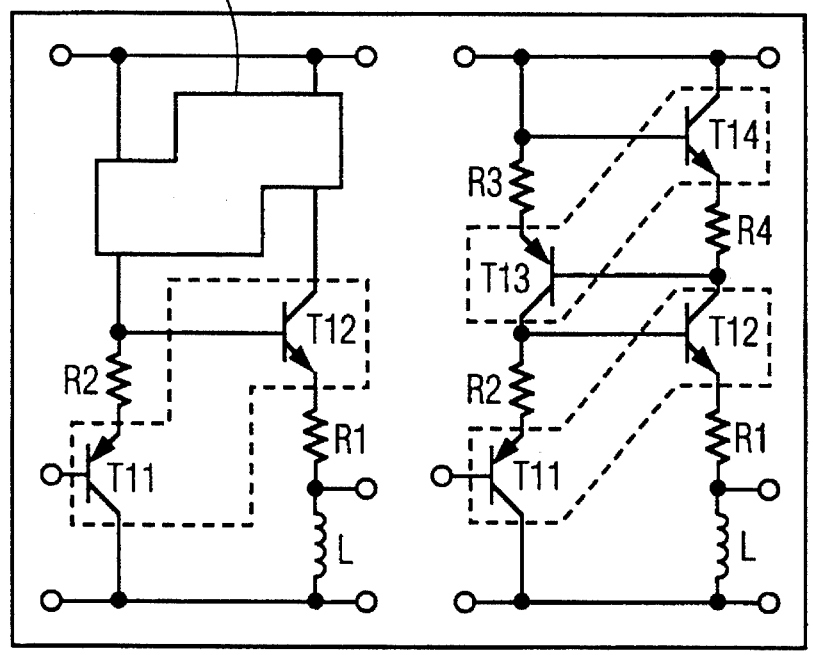

FIG. 3: a variant of the circuit in accordance with FIGS. 2A and B having a current supply circuit including complementary transistors for the formation of a vertical symmetry.

Figure 4:
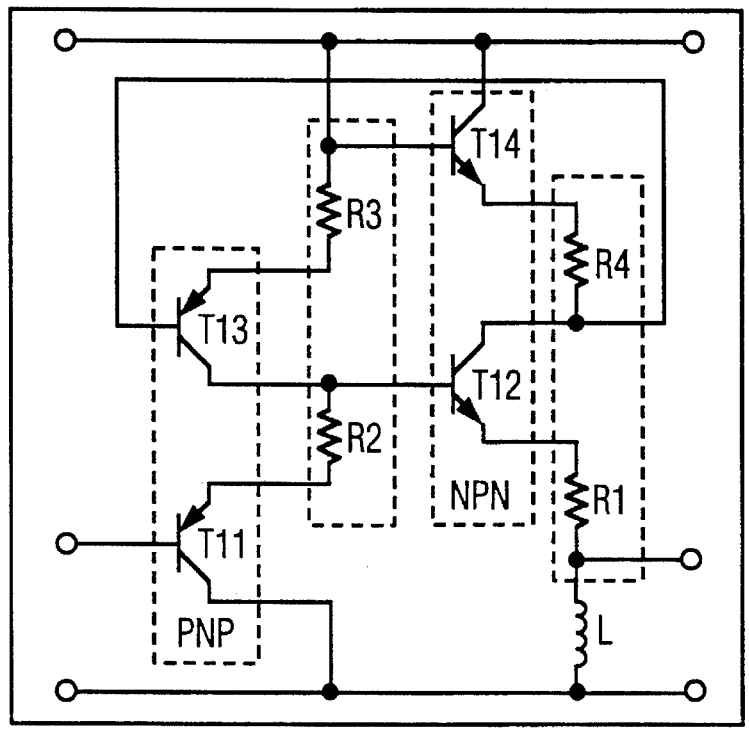

FIG. 4: a schematic diagram of the circuit in accordance with FIG. 3 including transistors formed in pairs on a common substrate.

Figure 5A:
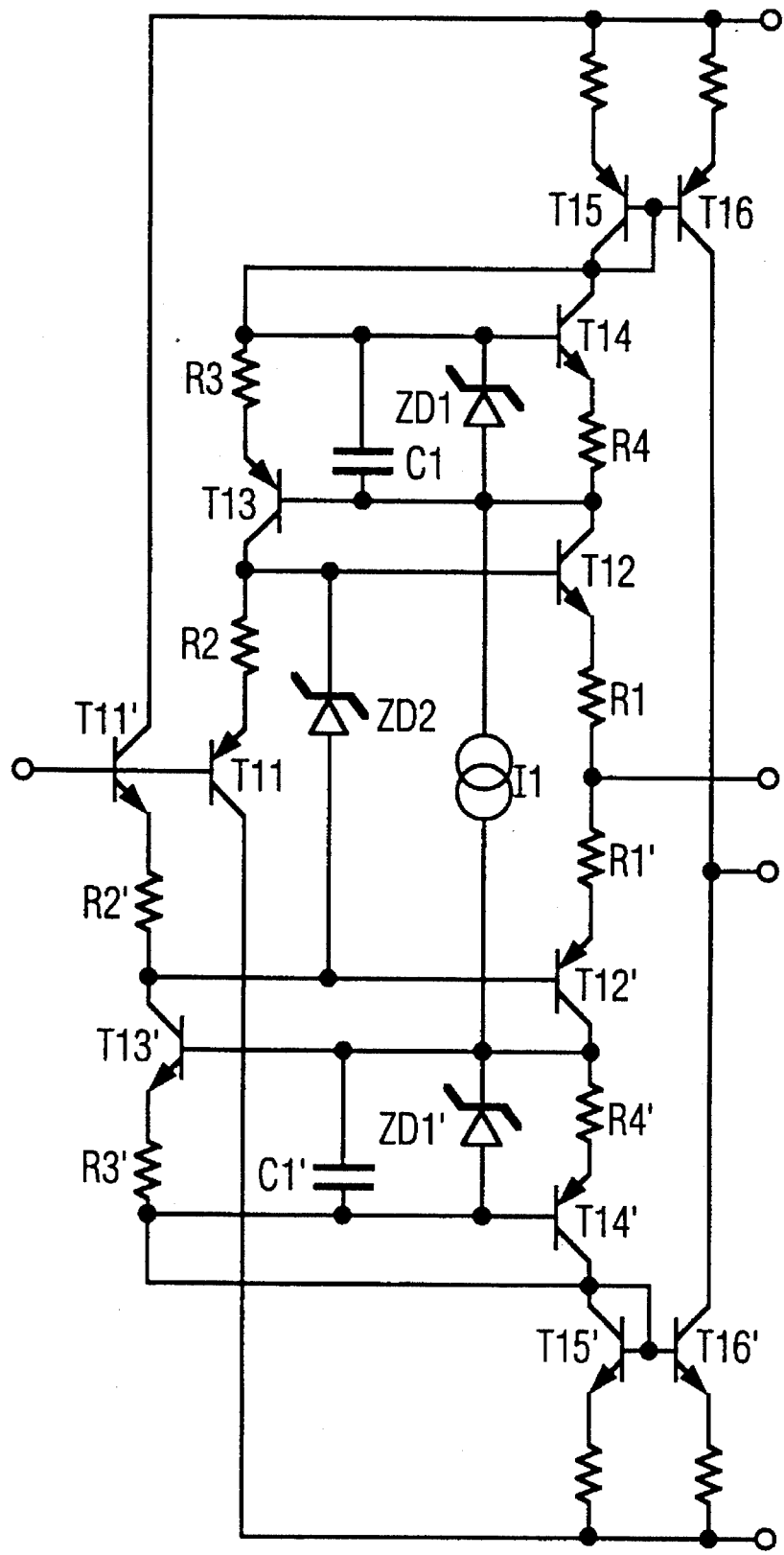

FIG. 5A: a complementary impedance converter constructed in accordance with the principle of FIGS. 3 and 4 including a current balancer and a circuit—internal quiescent current auxiliary path.

Figure 5B:
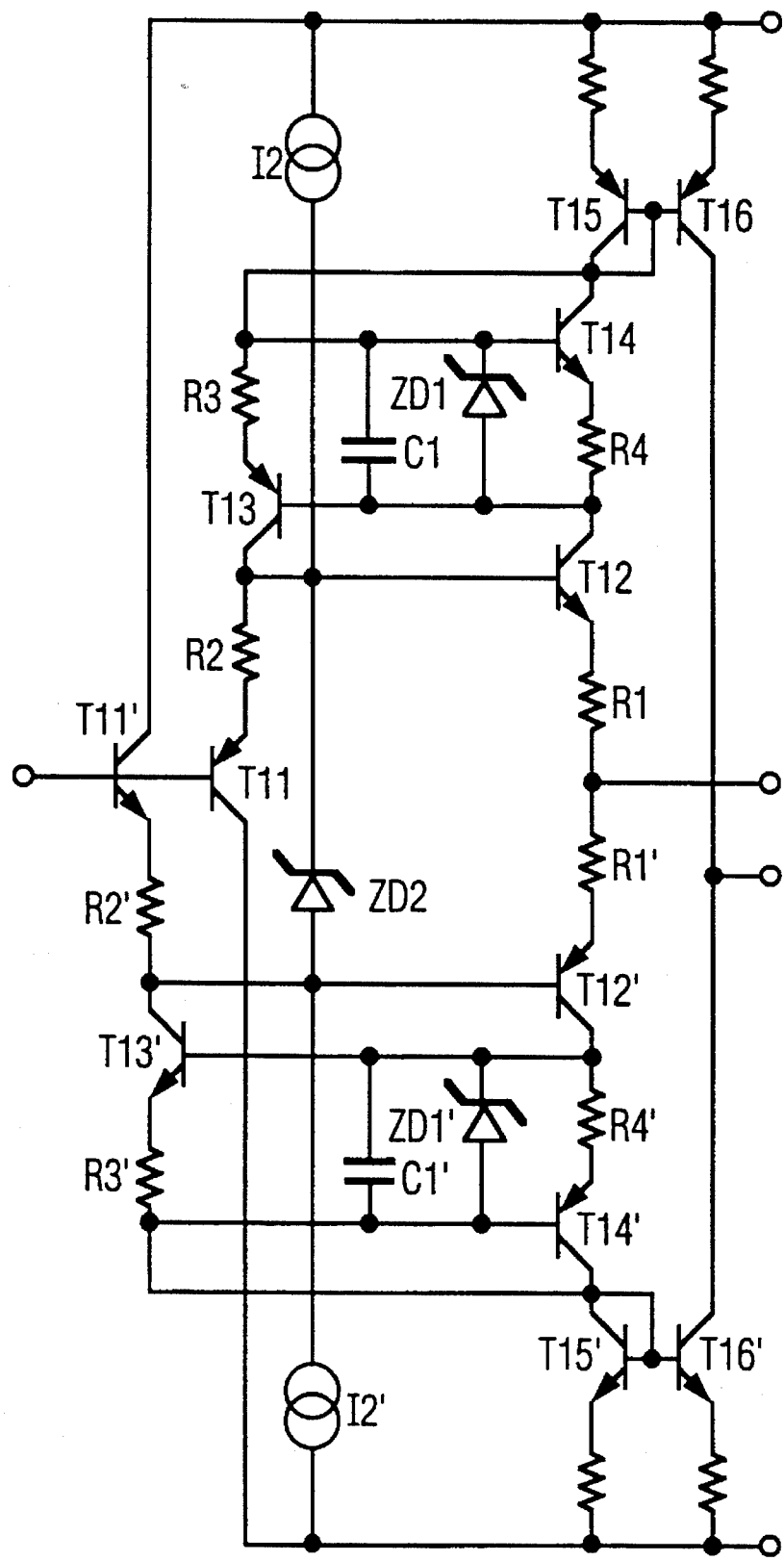

FIG. 5B: a complementary impedance converter constructed in accordance with the principle of FIGS. 3 and 4 having a doubly symmetrical quiescent current supply.

Figure 5C:
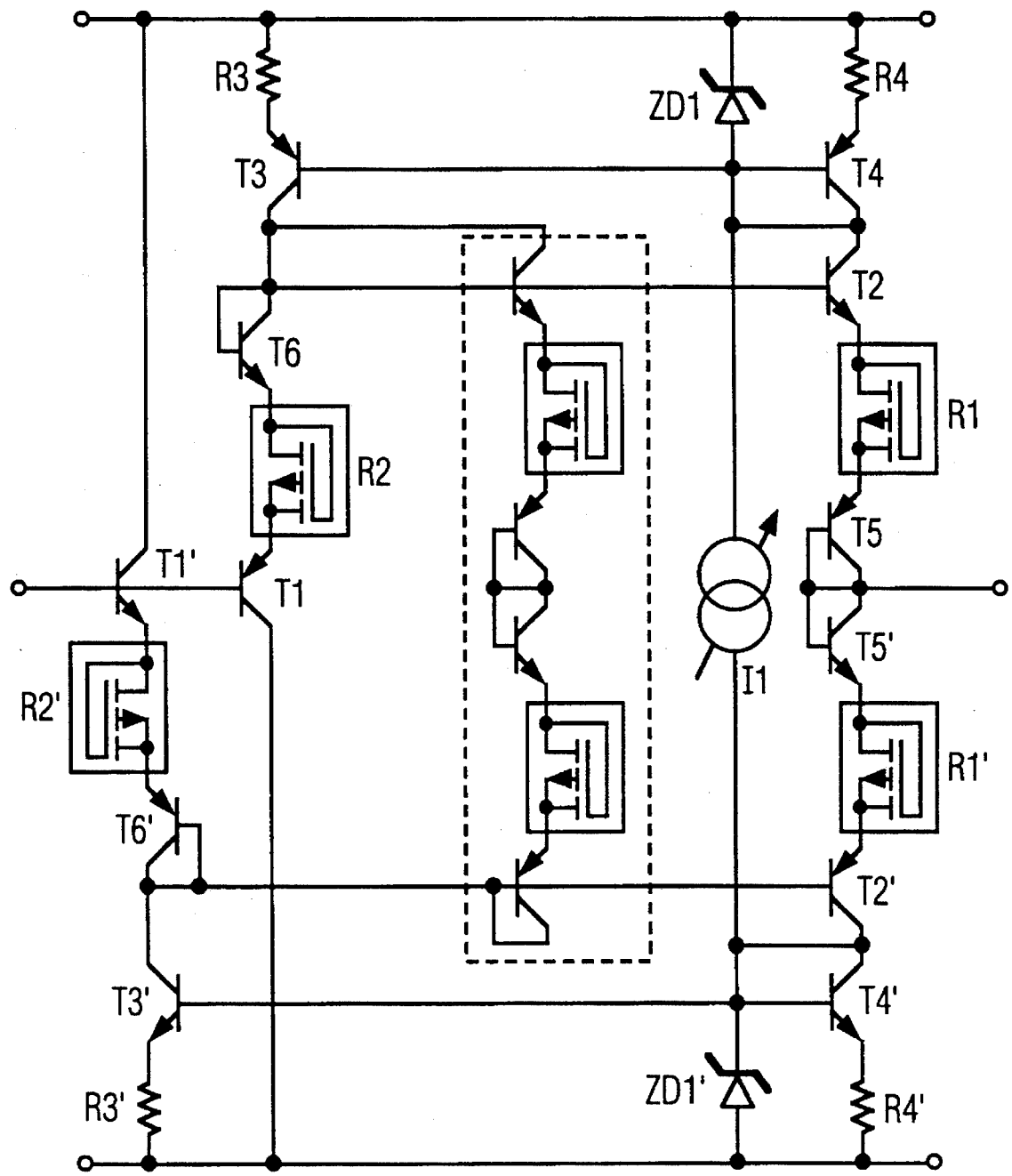

FIG. 5C: a complementary impedance converter constructed in accordance with the principle of FIGS. 2B including equal but non-linear resistors and an active transistor bias voltage source in the current limiting auxiliary path.

Figure 5D:
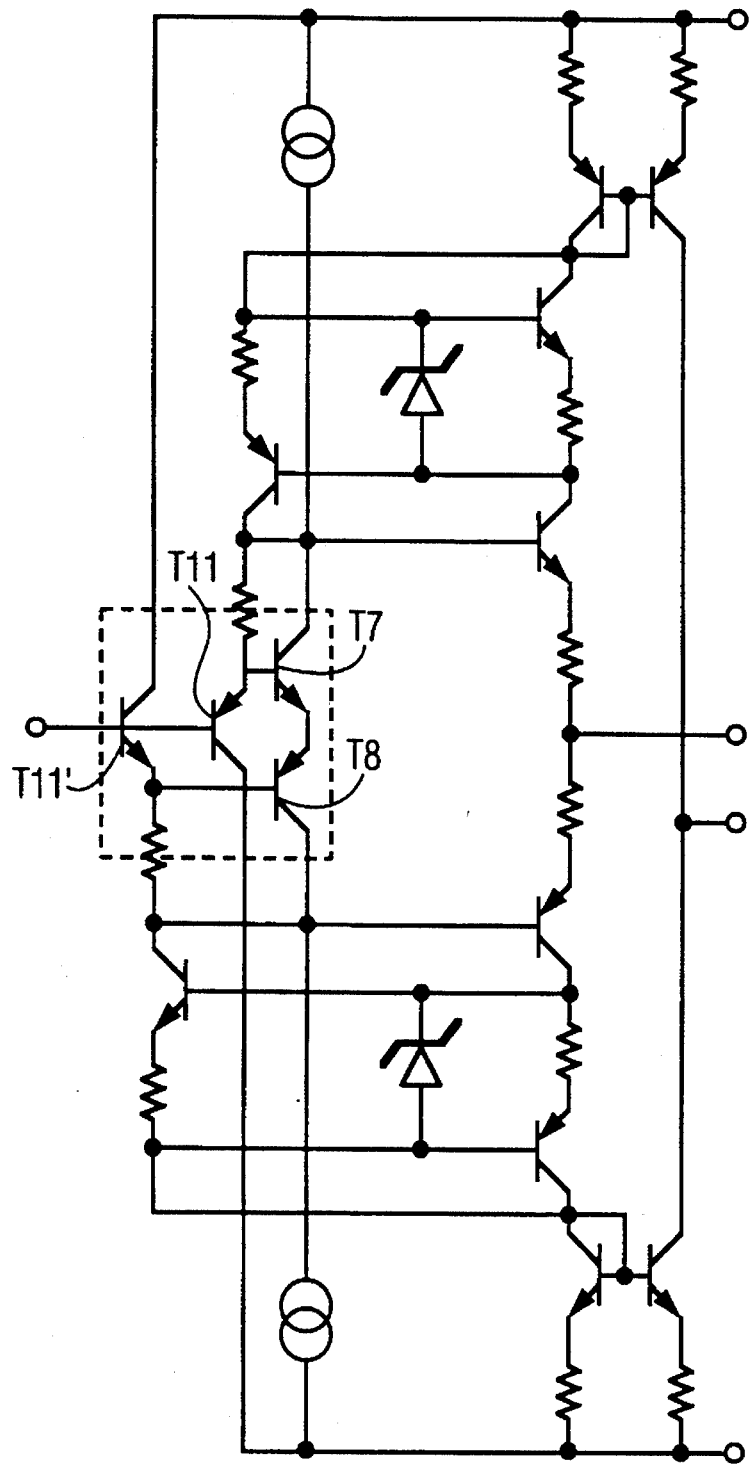

FIG. 5D: a complementary impedance converter constructed in accordance with the principle of FIGS. 3 and 4 including an active bias voltage source.

Figure 6:
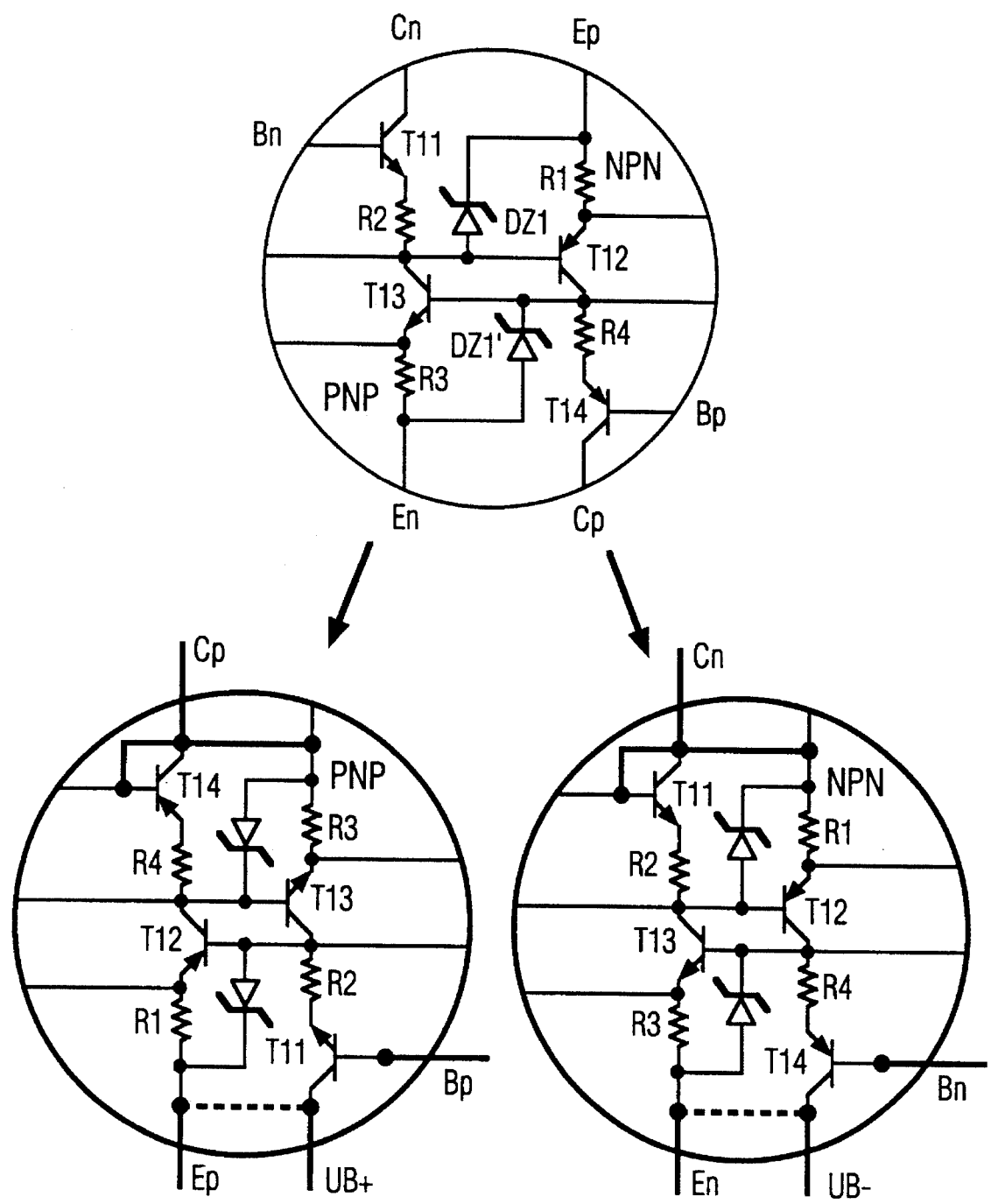

FIG. 6: a universal transistor module built up from the circuit arrangement of FIGS. 3 and 4.

Figure 7A:
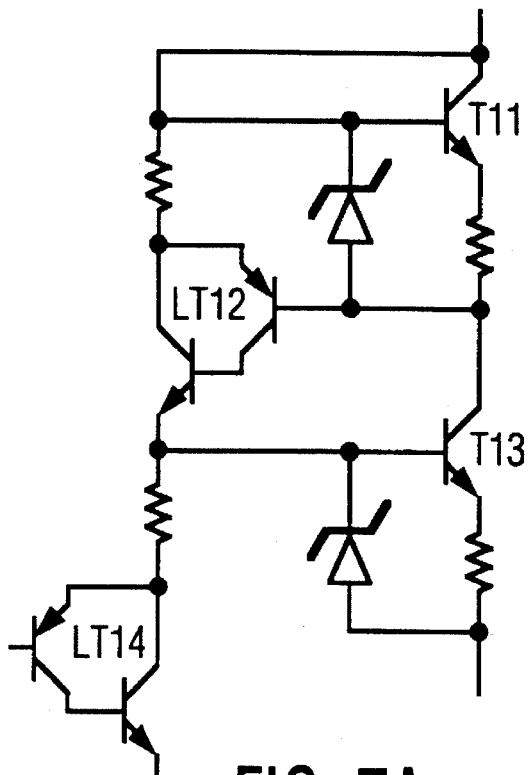

FIG. 7A: a module including a lateral pnp transistor.

Figure 7B:
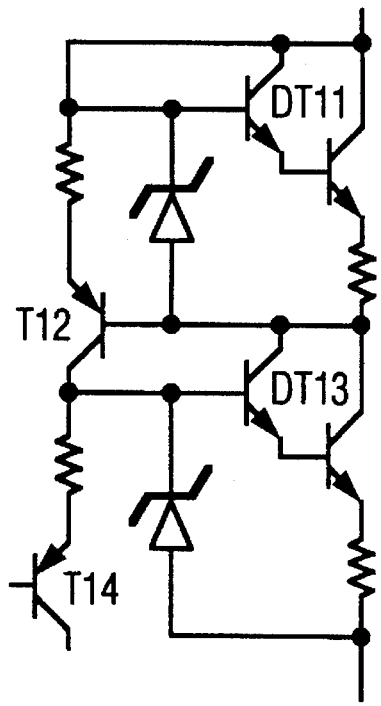

FIG. 7B: a module including a Darlington output circuit.

Figure 7C:
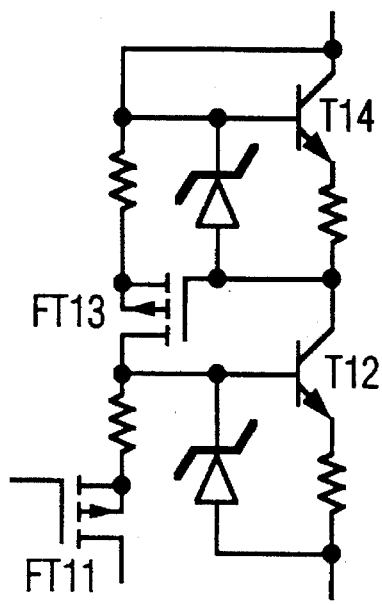

FIG. 7C: a module in accordance with FIG. 6 in hybrid technology.

Figure 7D:
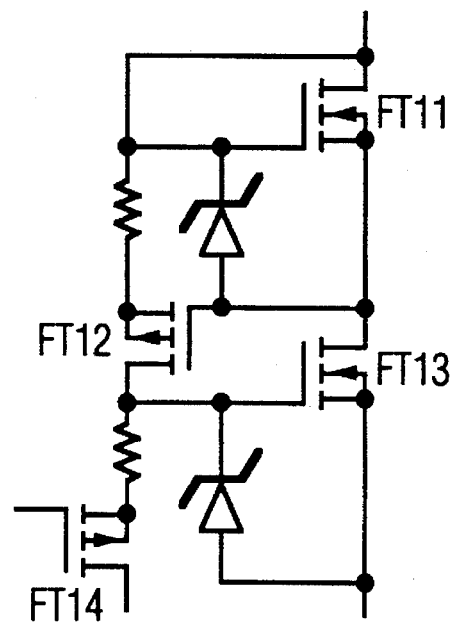

FIG. 7D: a module in accordance with FIG. 6 in MOSFET technology without additional resistors in the output circuit.

Figure 8A:
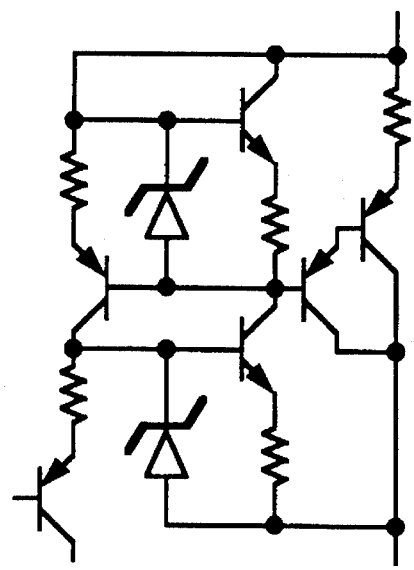

FIG. 8A: an integrated high power Darlington transistor.

Figure 8B:
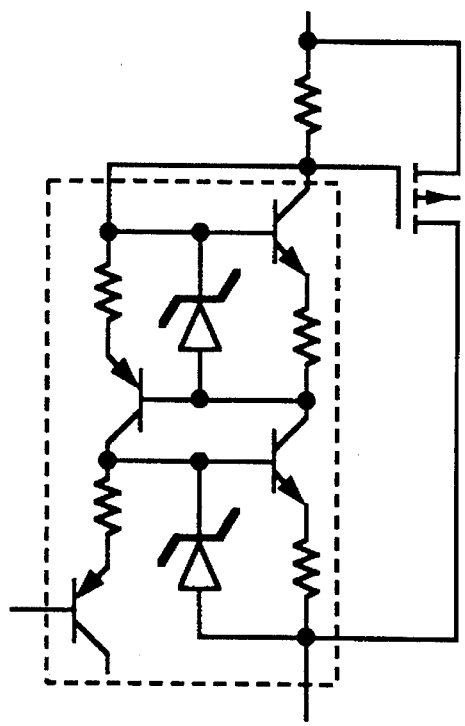

FIG. 8B: a discrete construction of a control stage and a current balancer.

Figure 8C:
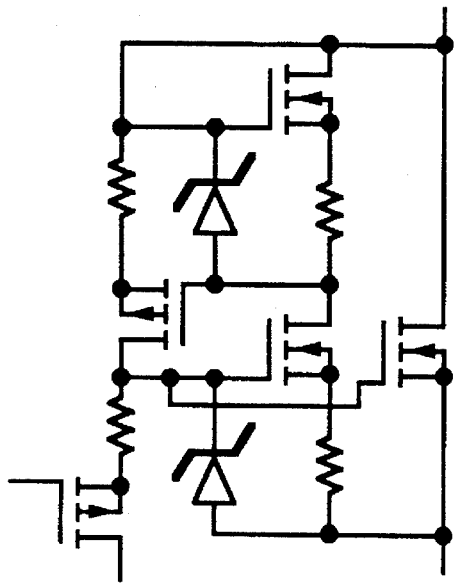

FIG. 8C: a compensated source follower.

Figure 8D:
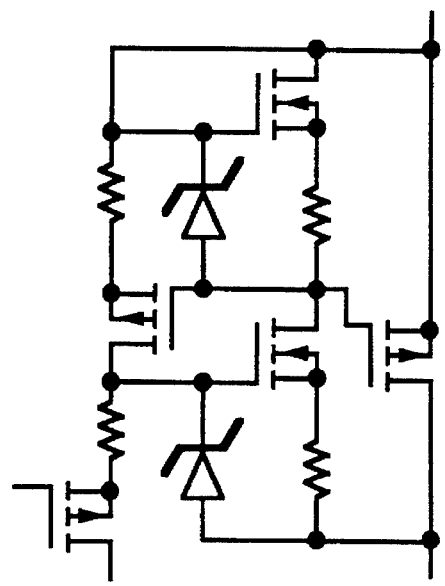

FIG. 8D: a current balanced source follower.

Figure 9:
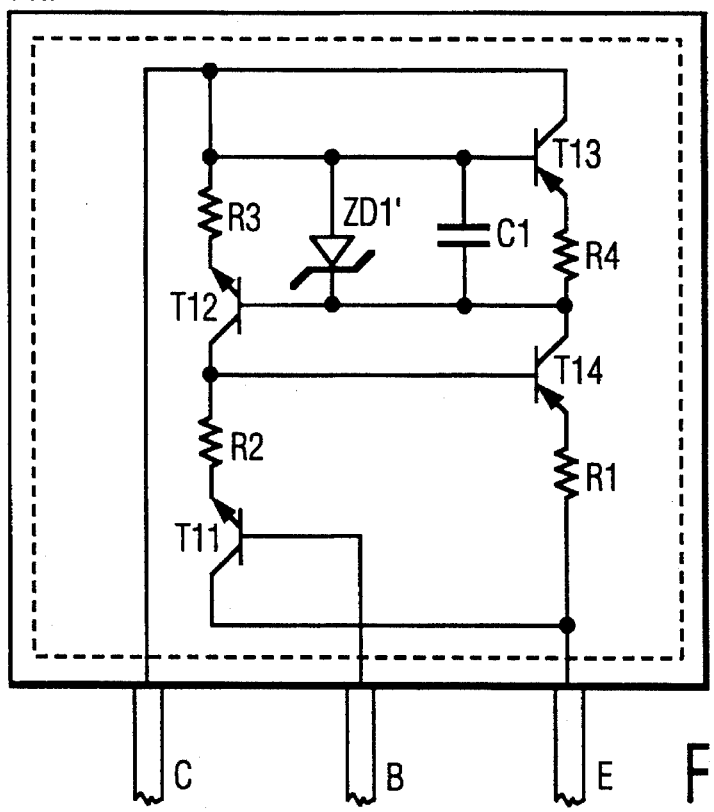

FIG. 9: a pnp transistor module.

Figure 10:
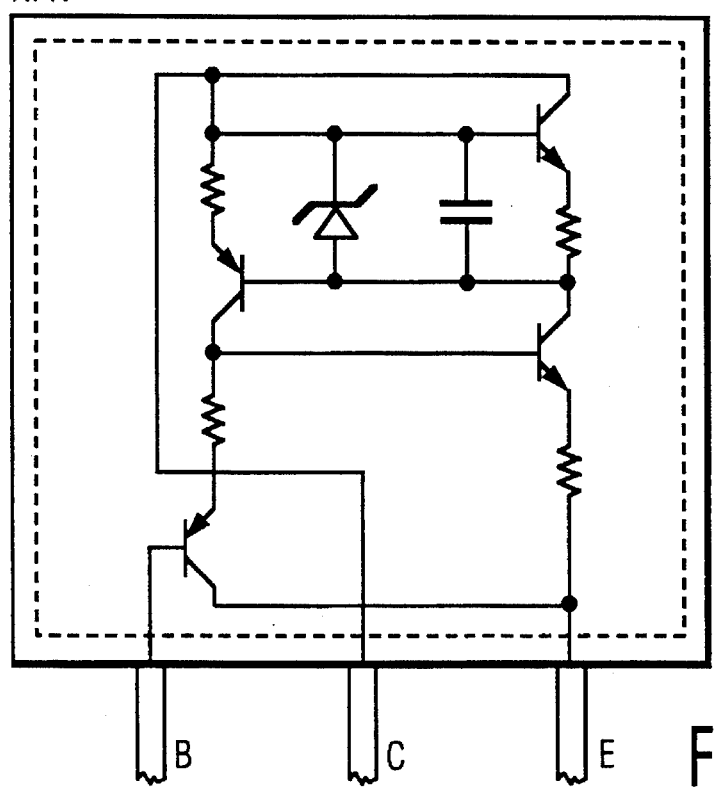

FIG. 10: an npn transistor module.

Figure 11:
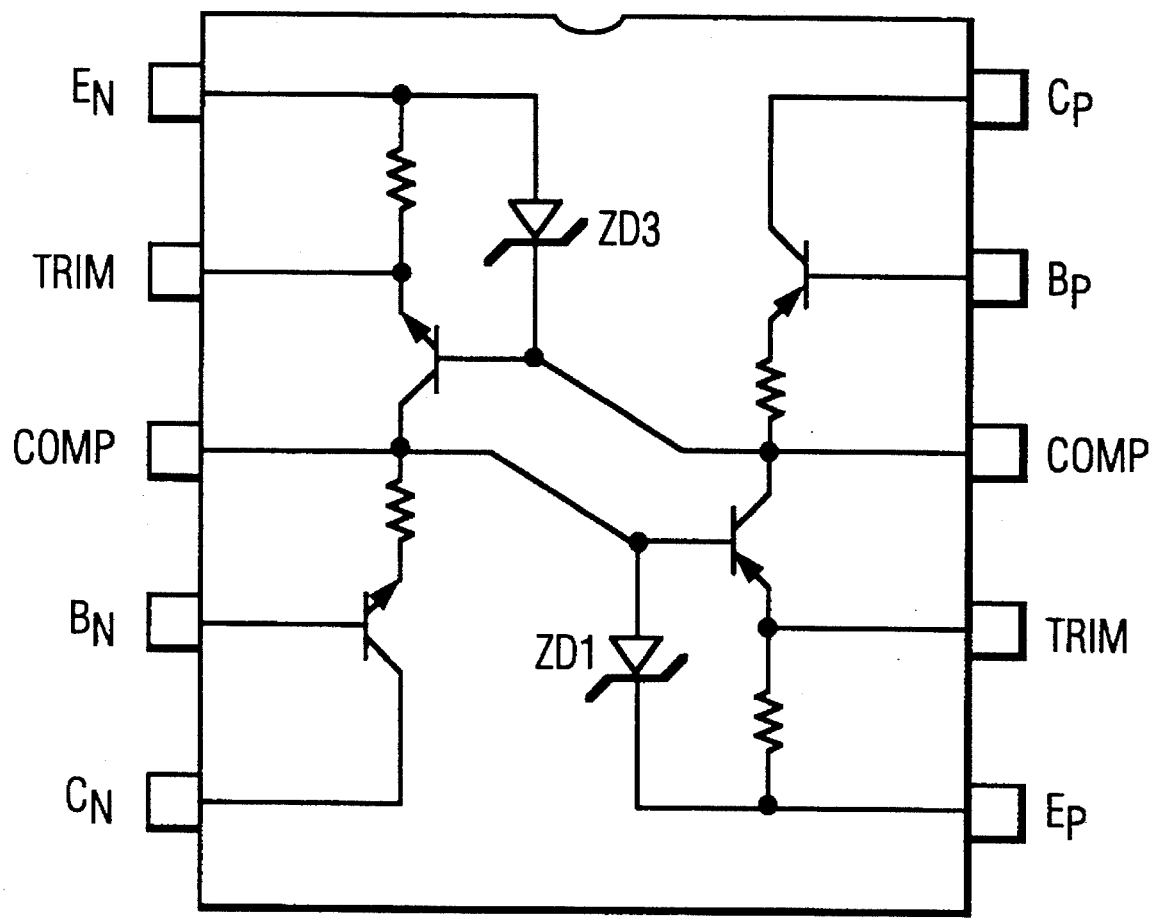

FIG. 11: a universally applicable integrated circuit.

Figure 12:
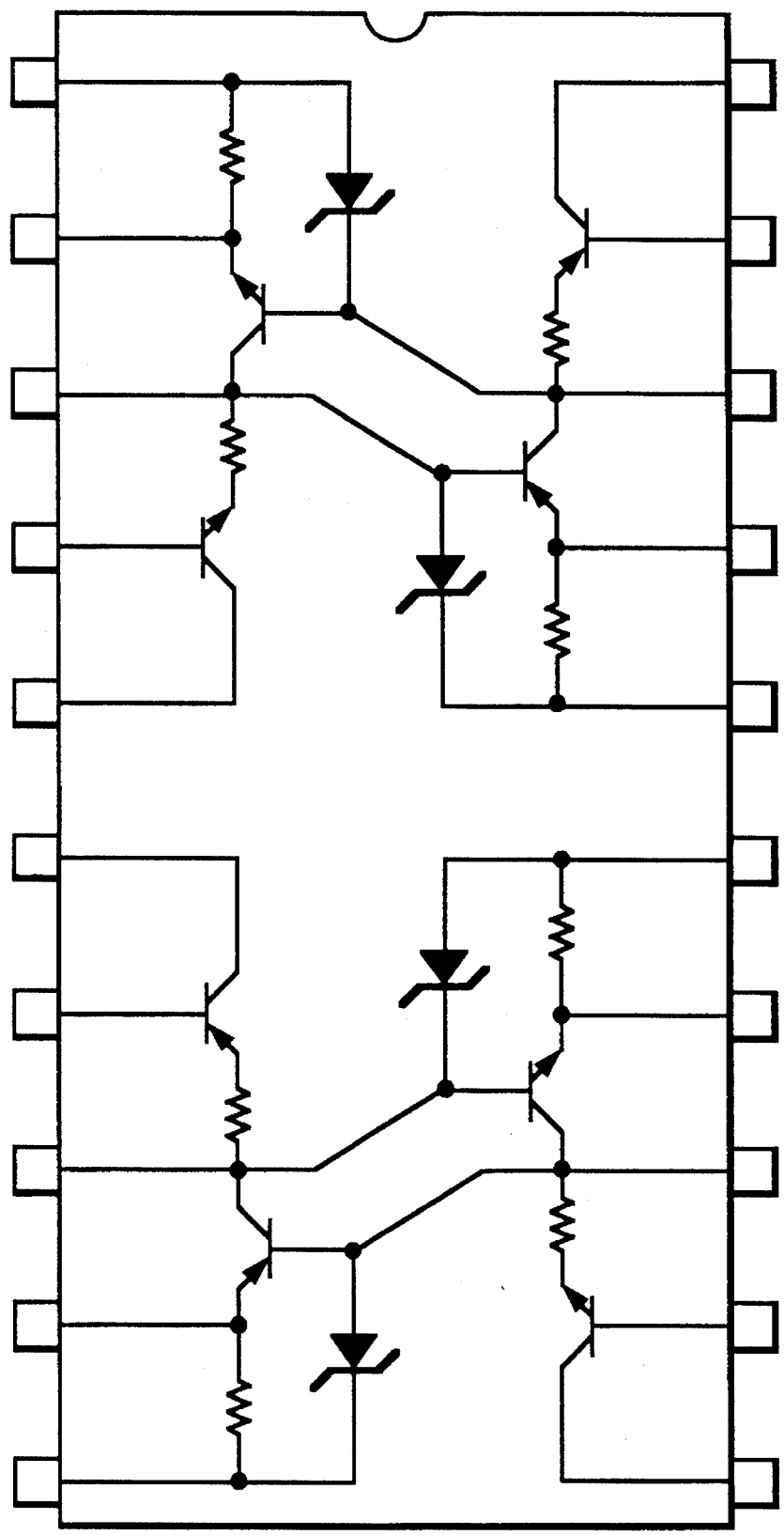

FIG. 12: a dual circuit in complementary technology.

Figure 13:
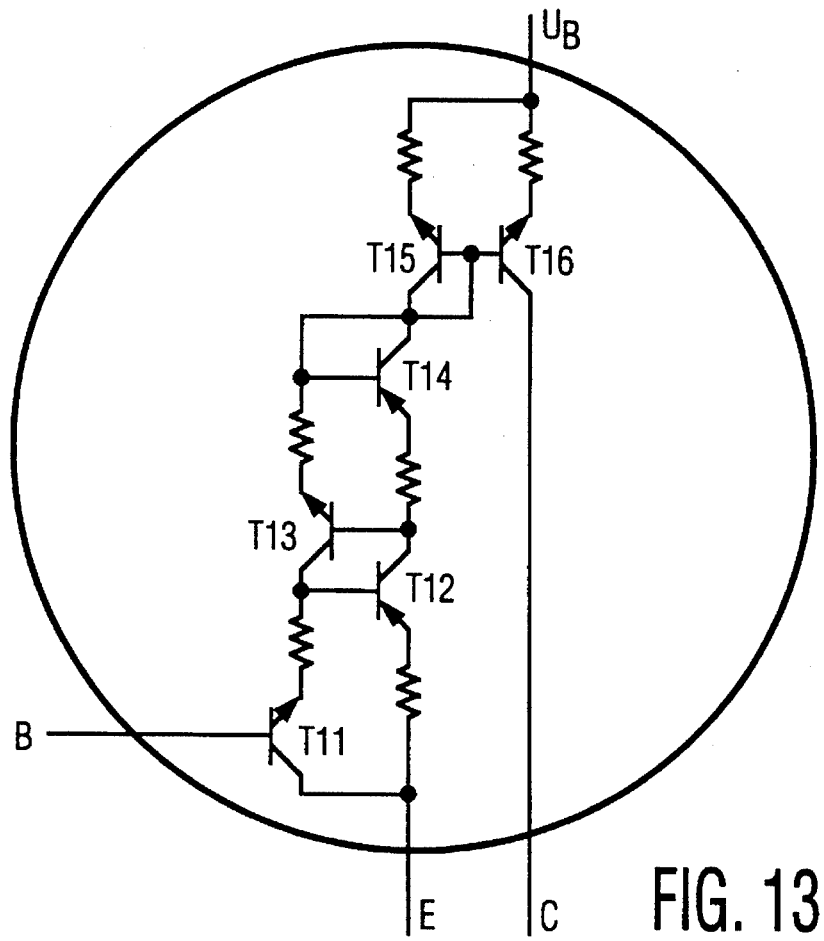

FIG. 13: a transistor module including a current balancing circuit.

Figure 14:
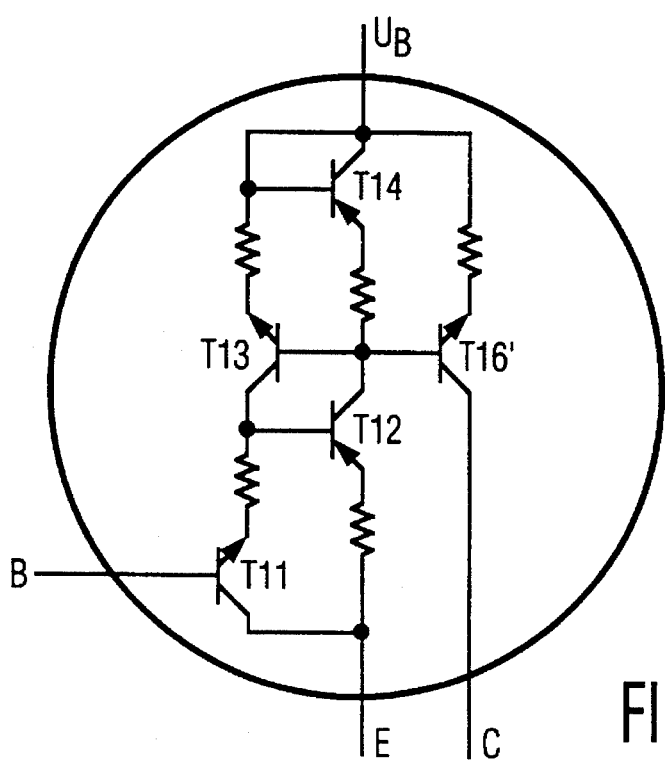

FIG. 14: a circuit modified vis a vis FIG. 13 but having the same effect.

In the embodiment illustrated in FIG. 1, an input signal terminal A is connected to a slider of a potentiometer P supplying the input signal. The base of a first bipolar transistor T1 which is formed as an npn transistor and the base of an inverse (pnp) transistor T1' is connected to the input signal terminal A. The emitter of the transistor T1 is connected to the base of a second transistor T2 which (likewise) is connected up as an emitter follower and its emitter is connected via a first resistor R1 to an output terminal B. A second resistor R2 is connected in the connection between the emitter of the first transistor T1 and the base of the second transistor T2.

The current supply to the two transistors T1 and T2 is effected by a current mirror which consists of two transistors T3 and T4 connected to each other at their bases. Their emitters are respectively connected via an emitter resistor R3 or R4 to a negative supply voltage D−. The transistor T4 of the current mirror which is associated with the second transistor T2 is connected as a diode i.e. it has a direct connection between its collector and its base. This current mirror, which, of itself, is known, causes equal currents to flow through the two transistors T1 and T2. The collector of the first transistor T1 is thereby connected to a positive supply voltage D+. The voltage falling on the first resistor R1 which varies with the transmitted signal, is added with exactly the same magnitude to the output signal if the second resistor R2 is selected to be of equal size to the first resistor R1. Since equal currents flow through the two resistors R1, R2, there are equal voltage drops across them. The input signal voltage, which is present on the emitter of the first transistor T1, would, without the second resistor R2, be reduced by the voltage drop on the first resistor R1. The signal voltage is increased by the voltage drop on the resistor R1 due to the voltage increase on the resistor R2 so that the voltage E on the base of the second transistor T2 corresponds to the negative signal voltage increased by the voltage drop on the resistor R2 (or, R1). Consequently, in the circuit arrangement in accordance with the invention, not only are the non-linear diode paths of the two transistors T1, T2 self compensating but so too are the voltage drops across the resistors R1, R2 if these are selected to be equally great. In this way, an impedance converter having an output resistance of zero can be realised. If the resistor R2<R1 is chosen, there remains a positive output resistance, while the output resistance is negative if R2>R1 is chosen.

The circuit arrangement illustrated in FIG. 1 is a complementary arrangement. The half of the circuit provided for the positive signal voltage corresponds to the just described half of the circuit for the negative signal voltage and is referenced with corresponding references supplemented by "'", i.e. by primed references.

Respective Zener diodes ZD1, ZD1', which limit the maximum current through the transistors T1, T2 or the transistors T3, T4 in the event that there is a short circuit on the output terminal for example, are arranged between the supply voltages D+ or D− and the appertaining bases of the transistors T3, T4 of the current mirrors.

A Zener ZD2 connected between the bases of the two second transistors T2 and T2' determines the working point on the characteristic curves of the two transistors T2, T2'. A resistor R5 connected to the collectors of the two transistors T4, T4' forms a quiescent current auxiliary path and enables a quiescent current when the circuit is switched-on.

FIG. 2A illustrates the basic circuit which has been embodied in FIG. 1. The two transistors T3, T4 which are as similar as possible form the current mirror and provide for an equally sized current through the transistors T1, T2 which are constructed to be complementary to one another.

In order to achieve the desired result for each working point of the circuit, not only must the characteristic curves of the transistors T3, T4 be the same but so too, in so far as possible, must the characteristic curves of the complementary transistors T1, T2. The circuit is thus based on a horizontal symmetry between the transistor pairs T3, T4 and T1, T2. The maintenance of this symmetry condition is only approximately possible for the complementary transistors T1, T2.

FIG. 2B shows how the input and output transistors are supplemented by a respective complementary diode transistor (T5, T6). The same characteristic control curve for horizontal symmetry of transistors and diode transistors on both sides results from the successive connection of two different diode paths. The circuit is constructed to be horizontally symmetrical and achieves a full compensation of the characteristic control curve distortions with a sufficiently exact construction of the transistors.

FIG. 3 shows a variant of the circuit in accordance with FIG. 2 which is based upon another functional principle. The transistors T11 and T12 are connected to each other in the same manner as the transistors T1 and T2 in the circuit in accordance with FIG. 2. A transistor T13 is arranged in series with the collector emitter path of the transistor T11 in the same manner as the transistor T3 in FIG. 2. In contrast however, a transistor T14 is formed with another polarity to that of the transistor T13 and is connected from its emitter to the collector of the transistor T12 via the resistor R4. With this circuit construction, there is a vertical symmetry since the transistors T11 and T13 are constructed with the same polarity, namely as pnp transistors, and the transistors T12 and T14 as npn transistors. FIG. 4 makes it clear that, expediently, the pnp transistors T11, T13 are constructed on a common chip so that they can exhibit a fully equal characteristic curve relationship to one another. In a similar manner, the npn transistors T12, T14 are constructed on a same chip. Likewise, the resistors R1, R2, R3, R4 can be built up equally in pairs so that there results a completely vertical symmetry. The operating principle of this circuit is now no longer based upon exactly equal currents flowing through the transistors T1, T2 due to the current mirror but rather, due to the vertical symmetry, that the circuitry is effected in the form of a bridge in which there are equal voltages in each partial path so that the input voltage present on the base of the transistor T11 taken against reference potential is equal to the output voltage present across a load resistor L. Thereby, completely different currents can flow in the two current branches T11, T13 or T12, T14 without interfering with the compensation of the non-linear characteristic curves of the transistors T11 to T14. For this, the resisters R1 to R4 must be dimensioned in accordance with the different currents. Thus, the circuits in accordance with FIGS. 3 and 4 utilize complementarily constructed "current mirrors" and are based on a vertically symmetrical construction in which the similar but possibly flawed npn transistors on the one side are exactly compensated by two (generally differently) flawed but similar npn transistors on the other side.

FIG. 5A shows a circuit which substantially corresponds to the circuit construction in accordance with FIG. 1 but which however, is realized in accordance with the circuit principles of FIGS. 3 and 4. A frequency dependent mutual coupling compensation is effected by a respective capacitor C1, C1' connected in parallel with the Zener diode ZD1, ZD1'. The complementary impedance converter can be relieved of power current by means of a power current mirror formed from two transistors T15, T16 or T15', T16' and thus merely serves as a control circuit. The current source I1 in one auxiliary current path of the circuit ensures that initially, when switching on the supply voltage (UB), a quiescent current is present in the circuit. In the on state, the current from the current source I1 flows via the complementary current mirror (T13, T14; T13', T14') into the bias voltage source ZD2.

FIG. 5B shows how an additional loading on the quiescent current of the complementary current mirror, which interferes with the vertical symmetry, can be avoided. The two equally weighted current sources (I2, I2') feed the current directly into the bias voltage source ZD2. A smaller low impedance component, such as, for example, a simple resistor, can also be used for the bias voltage source ZD2 since, here, there is a limited quiescent current feedback loop. The resistor can only draw as much current as is fed in externally via the current sources (I2 or I2'). Each further increase of the voltage across the resistor is coupled with a withdrawal of current from the circuit which is manifested in a lowering of the mutual coupling efficiency of the whole circuit. This process stabilises the quiescent current.

An offset trimming is also possible via the current sources.

FIG. 5C shows a circuit which was realized in accordance with FIG. 2B. The linear resistors are replaced by field effect transistor diodes which are non-linear as regards their voltage—current relationship. In this way, voltage dependent resistors are achieved which are similar to one another as regards their characteristic curves and the internal resistance associated therewith. The symmetry is maintained. The reason for the use of non-linear resistors lies in the unsymmetrical voltage and current division between the upper and lower part of the complementary circuit. During a signal modulation with equal circuit-internal voltage sweep widths in the upper and lower part of the circuit, there occurs a current increase in the (e.g.) upper part of the circuit which is several orders of magnitude greater than is caused in the lower part in terms of a current reduction. The circuit operates in a dynamically extended Class A region and thus needs a smaller quiescent current for a specific output power. The bias voltage source ZD2 is executed as a diode path in the quiescent current limiting auxiliary path of the circuit.

FIG. 5D shows an active thermally coupled transistor bias voltage source (T7, T8) in a circuit in accordance with FIG. 5B. The bias voltage transistor sources represent a highly voltage controlled resistor which is controlled by the voltage across the two base terminals of the complementary transistors. An excessive quiescent current or current increase is diverted, correspondingly in excess, via the collector leads into an auxiliary path, simply, the bias voltage source.

The circuit arrangement in accordance with the invention with its rigorous vertical symmetry opens up all sorts of applications of use. FIG. 6 shows an unwired module whose circuitry corresponds to FIG. 3. The connection of the supply voltage terminal UB of the first transistor (T11, T14) to the emitter of the second transistor (T12, T13) saves one external terminal of the module.

The base terminal Bp of the transistor T14 can thereby be wired up as the base of an npn transistor arrangement. By interconnecting the collector Cn and the base Bn of the transistor T11 (Cn) with the emitter terminal of the transistor T12 at the free end of the resistor R1 (Ep) and the collector of the transistor T14 (Cp) with the emitter terminal of the transistor T13 on the far side of the resistor R3 (En), these two interconnections form the emitter and the collector of the npn transistor.

In a similar manner, the module in accordance with FIG. 6 can be used as a pnp transistor for which purpose, the base of the transistor T11 (Bn) is used as the base input. The other terminals of the universal structure in accordance with FIG. 6 can be used for compensating and trimming purposes.

The FIGS. 7A to 7D show different mixed assemblies of modules having a maintained vertical symmetry. FIG. 7D shows a corresponding module in MOSFET technology using corresponding field effect transistors FT11 to FT14 and without additional resistors in the output circuit. This is possible given sufficiently high internal resistance of the transistor source and enough similarity of the characteristic curves of the two transistors (FT11, FT13).

Since, under the conditions of vertical symmetry, one is exclusively concerned with the identity of the amplifier modules which are connected in series with each other, the universal module in accordance with FIG. 6 can also be executed without complication using hybrid technology whereby, for example, two field effect transistors FT11 and FT13 are combined with two bipolar transistors T12 and T14 in a single module.

The FIGS. 8A to 8D show different applications of power transistors wherein the universal circuit serves both as a control stage for a power current source that itself operates non-linearly and also for control voltage de-emphasis for a power emitter or source follower.

Two special transistor circuits using pnp and npn technology are shown in the FIGS. 9 and 10. The two circuits differ from one another merely by virtue of the complementary construction of the transistors T11 to T14. They form synthetic linear transistor equivalent structures.

FIG. 11 shows the universal structure illustrated in FIG. 6 in an embodiment of an integrated circuit including symmetrically arranged Zener diodes ZD1 and ZD3 as protective diodes.

The complementary dual construction of the circuit in accordance with FIG. 11 leads to the circuit illustrated in FIG. 12 which is not pre-wired and thus has twenty terminals available. The number of terminals can be naturally reduced without difficulty by means of an internal pre-wiring.

It is apparent that the structures illustrated in the FIGS. 6 to 12 are universally applicable and open the way to a multiplicity of applications in dependence merely on the external wiring. Thus in particular, there can be realized output voltage loss free transistors which are fully compensated as regards characteristic curves and temperature through maintenance of the vertical symmetry in accordance with the FIGS. 3 and 4. The possible applications of use of modules of this type, and their advantages, are deducible without further commentary.

It is directly possible to immediately construct the transistors in accordance with the FIGS. 9 and 10 as power transistors in that the transistors T13 and T14 are constructed as a Darlington circuit and thus are suitable for high power purposes. Thereby, it is obviously also possible to construct the transistors T11 and T12 as Darlington circuits in order to thus produce a fully Darlington structure which leads to a reduced internal base current.

FIG. 13 shows a synthetic transistor equivalent structure which is built up with a converter circuit as is illustrated in principle in FIG. 3. This forms a base terminal B at the base of the transistor T11 and an emitter terminal E at its collector. A collector terminal C is decoupled from the converter circuit by a further current mirror T15, T16. A supply voltage UB is supplied to the current mirror via a special terminal. The thus resulting transistor structure having the terminals B, E and C allows the same setting of the quiescent voltage potentials at all three terminals B, E and C.

FIG. 14 likewise shows a transistor equivalent structure having the terminals B, E and C wherein the current balancing is effected with a transistor T16' which, together with the transistor T14, forms a current mirror. The transistor T14 is thus doubly used for two current mirrors T13, T14 and T14, T16'. A capacitative collector feedback to the converter circuit takes place via the collector base capacitance of the transistor T16'.

The modules illustrated in the FIGS. 13 and 14 permit of a voltage amplification in which the amplified voltage is derivable at the same potentials as the input potentials so that a plurality of stages can be directly connected one after the other.

I claim:

1. A transducer circuit comprising:

a first transistor having base, collector and emitter electrodes and having its base electrode connected to an input terminal;

a second transistor, of type complementary to said first transistor, having base, collector and emitter electrodes and having its base connected to the emitter electrode of said first transistor and its emitter electrode connected to an output terminal through a first non-linear voltage dependent resistor;

a current source for controlling current flow through the emitter-collector paths of said first and second transistors; and a second non-linear voltage dependent resistor connected between the emitter electrode of said first transistor and the base electrode of said second transistor, and wherein the current-voltage characteristics of the first and second non-linear voltage dependent resistors are equal.

2. A transducer circuit comprising:

an input terminal and an output terminal;

first and second transistors of complementary conductivity types, having respective base, collector and emitter electrodes, with the base electrode of said first transistor coupled to said input terminal;

first and second resistors, said first resistor being coupled between the emitter electrode of said first transistor and the base electrode of said second transistor, and said second resistor being coupled between the emitter electrode of the second transistor and said output terminal;

a current source, coupled to the collector electrode of the second transistor, to provide current in a series circuit path including the emitter electrode of the first transistor and the first resistor, in a substantially fixed proportion to current conducted in the emitter electrode of said second transistor.

3. The transducer circuit set forth in claim 2 further including:

a first diode connected transistor, of similar conductivity type to said first transistor, serially connected with said second resistor between the emitter electrode of said second transistor and said output terminal; and a second diode connected transistor, of similar conductivity type to said second transistor, serially connected with said first resistor between the emitter electrode of said first transistor: and the base electrode of said second transistor; wherein said first and second diode connected transistors are poled to conduct current in the same directions as the second and first transistors respectively.

4. The transducer circuit set forth in claim 2 wherein the current source comprises:

third and fourth transistors of like conductivity types to said first and second transistors respectively, having respective base, collector and emitter electrodes, with the base and collector electrodes of the third transistor connected to the collector and base electrodes of the second transistor respectively;

third and fourth resistors, said third resistor connected between the collector electrode of the second transistor and the emitter electrode of the fourth transistor, and the fourth resistor coupled between the emitter electrode of the third transistor and the base electrode of the fourth transistor; and means coupling the base and collector electrodes of the fourth transistor to a source of operating potential.

5. The transducer circuit set forth in claim 2 wherein said first resistor has a larger resistance than said second resistor and said output terminal exhibits negative impedance.

6. The transducer circuit set forth in claim 2 wherein said first and second resistors are field effect transistors respectively having gate and drain electrodes connected to form one connection of a respective resistor and a source electrode forming a second connection of said respective resistor.

7. The transducer circuit set forth in claim 2 wherein said current source comprises:

a current mirror amplifier having an input connection coupled to the collector electrode of said second transistor and an output connection coupled to said circuit path.

8. The transducer circuit set forth in claim 7 wherein said current mirror amplifier includes;

a third transistor having a collector-emitter path in series with the output connection of the current mirror amplifier;

a fourth transistor having a collector-emitter path in series with the input connection of the current mirror amplifier; and wherein the third and fourth transistors are of the same conductivity types as the first and second transistors respectively.

9. The transducer circuit set forth in claim 2 further including:

third and fourth transistors of complementary conductivity types to said first and second transistors respectively, having respective base, collector and emitter electrodes, with the base electrode of said third transistor coupled to said input terminal;

third and fourth resistors, said third resistor coupled between the emitter electrode of said third transistor and the base electrode of said fourth transistor, and the fourth resistor being coupled between the emitter electrode of the fourth transistor and said output terminal;

a further current source coupled to provide current, in a circuit path including the emitter electrode of the third transistor and the third resistor, in a substantially fixed proportion to current conducted in the emitter electrode of said fourth transistor.

10. The transducer circuit set forth in claim 9 further including:

a voltage bias source coupled between the base electrodes of the second and fourth transistors, for setting a quiescent operating current of said transducer.

11. The transducer circuit set forth in claim 10 wherein said voltage bias source comprises:

fifth and sixth transistors of conductivity type similar to said second and first transistors respectively, said fifth and sixth transistors having respective emitter electrodes interconnected, having respective collector electrodes connected to the base electrodes of the second and fourth transistors respectively, and having respective base electrodes connected to the emitter electrodes of the first and third transistors respectively.

12. The transducer circuit set forth in claim 10 wherein said voltage bias source includes:

a voltage dependent impedance coupled between the base electrodes of the second and fourth transistors;

a first constant current source coupled to the base electrode of the second transistor;

a second constant current source coupled to the base electrode of the fourth transistor.

13. The transducer circuit set forth in claim 12 wherein said voltage dependent impedance comprises a zener diode.

14. A transducer circuit comprising:

an input terminal and an output terminal;

first and second transistors of complementary conductivity types, having respective control, first and second electrodes, with the control electrode of said first transistor coupled to said input terminal, and wherein current conducted between the first and second electrodes of a respective transistor is controlled by potential applied between its control and first electrodes;

first and second resistors, said first resistor being coupled between the first electrode of said first transistor and the control electrode of said second transistor, and said second resistor being coupled between the first electrode of the second transistor and said output terminal;

a current source including, third and fourth transistors of like conductivity type, having respective control, first and second electrodes, having their respective control electrodes interconnected and coupled to the second electrode of said second transistor, their respective first electrodes coupled to a source of operating potential, and their respective second electrodes coupled to the second and control electrodes of the second transistor respectively, whereby current provided by said third transistor flows through a serial connection of said second resistor and the first electrode of the second transistor, and current provided by the fourth transistor flows through a serial connection of said first resistor and the first electrode of the first transistor.

* * * * *